(12) United States Patent
Hailey et al.

(10) Patent No.: US 6,337,798 B1
(45) Date of Patent: Jan. 8, 2002

(54) DIGITAL CIRCUIT DECOUPLING FOR EMI REDUCTION

(75) Inventors: Jeffrey C. Hailey; Todd W. Steigerwald, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/491,290

(22) Filed: Jan. 25, 2000

(51) Int. Cl.[7] .............................. H05K 1/18; H05K 1/00; H04B 3/28
(52) U.S. Cl. ........................... 361/763; 333/12; 174/250
(58) Field of Search .................................. 361/763, 818, 361/760, 761, 762, 777; 307/91; 176/250, 260; 333/12, 186

(56) References Cited

U.S. PATENT DOCUMENTS

| | | | |
|---|---|---|---|
| 4,982,120 A | 1/1991 | Longwell et al. ........... 307/572 |
| 5,455,466 A | 10/1995 | Parks et al. .................. 307/104 |
| 5,708,400 A * | 1/1998 | Morris .......................... 333/12 |
| 5,841,686 A * | 11/1998 | Chu et al. ..................... 365/51 |
| 6,166,457 A * | 12/2000 | Iguchi et al. ................. 307/91 |

* cited by examiner

*Primary Examiner*—Brian Sircus
*Assistant Examiner*—Chandrika Prasad
(74) *Attorney, Agent, or Firm*—Skjerven Morrill MacPherson LLP

(57) ABSTRACT

A printed circuit board assembly characterized by at least two decoupling capacitors for decoupling transient currents resulting from, for example, logic transitions in high-speed digital circuitry. The decoupling capacitors are physically arranged, and electrically connected between a power plane and a ground plane, so that transient currents flow in respectively opposite directions through the capacitors, thereby maximizing the capacitors' mutual inductance, and thus minimizing the electromagnetic interference generated by the capacitors.

36 Claims, 4 Drawing Sheets

DIGITAL CIRCUIT DECOUPLING FOR EMI REDUCTION

BACKGROUND OF THE INVENTION

1. Field of the Invention

This invention relates to the design and fabrication of electronic equipment and, more particularly, to the design of a printed circuit board (PCB) that increases electromagnetic coupling between discrete decoupling capacitors mounted on the surface(s) of such PCB.

2. Description of the Related Art

A significant consideration in the design and fabrication of compact (and therefore densely assembled), high-speed digital equipment is the need to minimize the effects of ringing, crosstalk, radiated noise and other forms of electromagnetic interference (EMI). However, design approaches seeking to minimize EMI effects are generally susceptible to straight forward circuit analysis. In fact, although entire textbooks have been devoted to techniques for combating EMI, the subject continues to be viewed as "black magic". See, for example, Howard Graham, "High-Speed Digital Design," Prentice Hall PTR, Saddle River, N.J. (1993).

High-speed digital circuits and systems frequently draw large transient currents during short intervals, when, for example, logic circuits and devices change state. Often logic transitions take place with brief rise and fall times, under the control of increasingly high-frequency clock signals. Because realizable voltage sources for digital circuitry are characterized by series resistances and inductances, decoupling capacitors are commonly relied on to supply transient current requirements during transition intervals. The coupling capacitors are typically electrically connected between a voltage supply and ground and serve to mitigate the effects of the nonzero voltage supply source impedance. The decoupling capacitors therefore, tend to maintain the output of the voltage supply by providing a significant portion of the transient current.

However, the ability of commercially available capacitors to supply current at high frequencies is limited by the parasitic lead inductance that is characteristic of such capacitors. In addition to the inductance associated with capacitor leads, the finite inductance of each via that may be used, for example, to attach a power supply plane to a ground plane introduces a small, but measurable inductance. The magnitude of this inductance is approximately:

$$L = 5.08\,h\left[\ln\left(\frac{4h}{d}\right) + 1\right]$$

where

L=inductance of via, nH, h=length of via, inches d=diameter of via, inches

Parasitic inductance is unavoidable because current flowing in a capacitor will create lines of flux. The effect of parasitic lead inductance is aggravated by the additional inductance that is inherent to the physical layout of electronic circuitry. This additional inductive component arises both from the conductive traces imparted to the PCB, as well as from the physical proximity of discrete components, both active and passive.

EMI may be encountered in PCBs in at least two modes. As suggested above, differential mode (DM) EMI results from currents that flow in a loop through various components or circuits on the PCB. DM EMI can be reduced either by reducing the current that flows in the loop, or by reducing the area subtended by the loop. EMI is also encountered as a result of voltage drops related to induced impedance. The form of EMI is referred to as common mode (CM) EMI because it may be transmitted across an entire circuit. CM EMI may be reduced by decreasing the rate of change of current (dI/dt) that causes the CM EMI, or by decreasing the inductance in the current path.

Decoupling capacitors are, as with any component of high-speed digital circuit, susceptible to both DM and CM EMI phenomena. A prevalent approach to reducing the effects of parasitic inductance associated with decoupling capacitors is simply to connect a number of decoupling capacitors in parallel between the voltage supply and GND. When the decoupling capacitors are connected in parallel, the effective parasitic inductance is reduced, approximately by a factor equal to the number of capacitors that are connected in the parallel configuration. It is not surprising, then, that a number of commercially available discrete capacitors, and capacitor arrays, are designed in this manner to minimize the parasitic inductance of capacitors. Specifically, AVX Corporation, Myrtle Beach, S.C., manufacturers and distributes a product line of capacitor configurations under various product designations, such as DCAP, Low Inductance Capacitor Array (LICA), the Power Plane Decoupling Capacitor, the Interdigital Capacitor and the Reverse Terminal Capacitor. Capacitor arrays such as the above and others are recognized as affording improved decoupling, with reduced parasitic inductance. However, such arrays typically command a price premium when compared to the standard surface mount technology (SMT) decoupling capacitor.

Accordingly, what is desired is an economical approach to the arrangement of multiple decoupling capacitors on a printed circuit board. The objective is to reduce parasitic inductance as well as EMI effects. Furthermore, it is another object of the invention to further reduce EMI by limiting the mutual inductance exhibited between capacitor bodies that are situated in proximity on a PCB. Reduction of mutual induction will also result in corresponding reductions in CM EMI. An additional desired result is the reduction in DM EMI by constraining the area of the current loop circumscribed by the decoupling capacitors. Finally, it is preferred that the above results be achieved with commonly available, discrete SMT decoupling capacitors, thereby avoiding premium prices that accompany exotic capacitor arrays.

SUMMARY OF THE INVENTION

The above and other objects, advantages and capabilities are achieved in one aspect of the invention by circuit assembly that comprises a printed circuit board (PCB) that is characterized by a first exterior surface, a first internal conductive layer, and a second internal conductive layer. First and second discrete capacitive elements, each having conductive terminals disposed at opposing extremities of the associated capacitive element, are laterally juxtaposed on the first exterior surface of the PCB so that the first conductive terminal of the first capacitive element is disposed adjacent to the first conductive terminal of the second capacitive element and is disposed remotely from the second conductive terminal of the second capacitive element. A first conductor couples the first conductive terminal of the first capacitive element to the first internal conductive layer; a second conductor couples the second conductive terminal of the first capacitive element to the second internal conductive layer; a third conductor couples the first conductive terminal of the second capacitive element to the second conductive layer; and a fourth conductor couples the second conductive terminal of the second capacitive element to the first internal conductive layer.

Another aspect of the invention contemplates a printed circuit board (PCB) characterized by a first exterior surface, a first internal conductive layer, and a second internal conductive layer. First and second discrete capacitive elements, each having conductive terminals disposed at opposing extremities of the associated capacitive element, are mutually juxtaposed on the first exterior surface of the PCB so that the first conductive terminal of the first capacitive element is disposed adjacent to the first conductive terminal of the second capacitive element and remotely from the second conductive terminal of the second capacitive element. A conductor array couples two of the conductive terminals to the first internal conductive layer and couples two of the conductive terminals to the second internal conductive layer.

Another additional manifestation of the invention is represented by a circuit assembly that comprises a printed circuit board (PCB) characterized by a first exterior surface, a second exterior surface, a first internal conductive layer, and a second internal conductive layer. First and second discrete capacitive elements each have respective first and second conductive terminals disposed at opposing extremities of the associated capacitive element The first capacitive element is positioned on the first exterior surface, and the second capacitive element is positioned on the second exterior surface, substantially orthogonally aligned with the first capacitive element. A first conductor couples the first conductive terminal of the first capacitive element to the first internal conductive layer; a second conductor couples the second conductive terminal of the first capacitive element to the second internal conductive layer; a third conductor couples the first conductive terminal of the second capacitive element to the second internal conductive layer; and a fourth conductor couples the second conductive terminal of the second capacitive element to the first internal conductive layer.

Yet another ramification of the invention is embodied in a printed circuit board adapted for the arrangement of at least two capacitive elements, each of the capacitive elements having respective first and second conductive terminals. The PCB comprises an exterior surface for supporting the capacitive elements, a first internal conductive layer, a second internal conductive layer, and a conductive array for selectively coupling each of the conductive terminals of the capacitive elements to either the first internal conductive layer or the second internal conductive layer and for reducing electromagnetic coupling between the capacitive elements.

Similarly, the invention resides in a printed circuit board (PCB) adapted for the arrangement of at least a first capacitive element and a second capacitive element, each of which capacitive elements has respective first and second conductive terminals. The PCB comprises a first exterior surface for supporting the first capacitive element, a second exterior surface for supporting the second capacitive element, a first internal conductive layer, a second internal conductive layer, and a conductive array for selectively coupling each of the conductive terminals of the respective capacitive elements to either the first internal conductive layer or the second internal conductive layer and for reducing the electromagnetic coupling between the capacitive elements.

The invention may also be exploited in various types of electronic equipment, including, but not limited to, computer systems, which equipment includes printed circuit assemblies comprising multilayer printed circuit boards (PCBs). The PCBs are characterized by a first and second exterior surface, and by first and second internal conductive layers. The printed circuit assembly also comprises first and second discrete capacitors, juxtaposed on the PCB in a manner that tends to minimize the capacitor's mutual inductance. A first conductor couples the first conductive terminal of the first capacitive element to the first internal conductive layer; a second conductor couples the second conductive terminal of the first capacitive element to the second internal conductive layer; a third conductor couples the first conductive terminal of the second capacitive element to the second conductive layer; and a fourth conductor couples the second conductive terminal of the second capacitive element to the first internal conductive layer.

BRIEF DESCRIPTION OF THE DRAWINGS

The present invention may be better understood, and its numerous objects, features and advantages made apparent to those skilled in the art, with reference to the Drawings described below and attached hereto, in the several Figures of which like reference numerals identify indentual elements and where.

DETAILED DESCRIPTION OF THE PREFERRED EMBODIMENTS

Figure 1A:
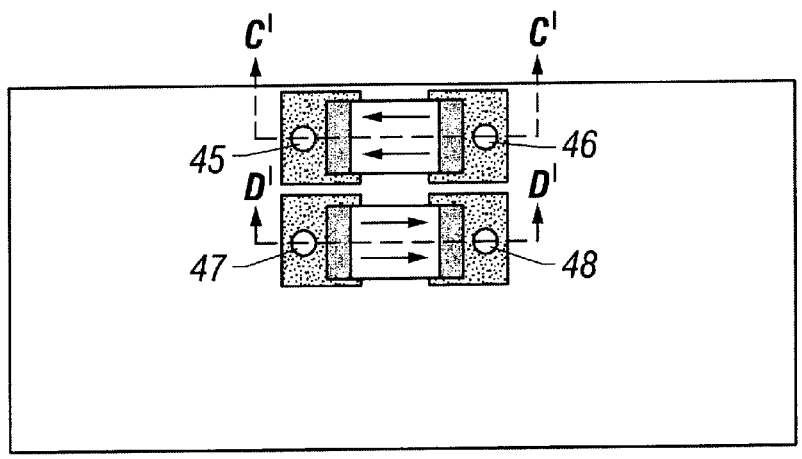
FIG. 1A is top view of a pair of laterally juxtaposed capacitors on a PCB.
Figure 1B:
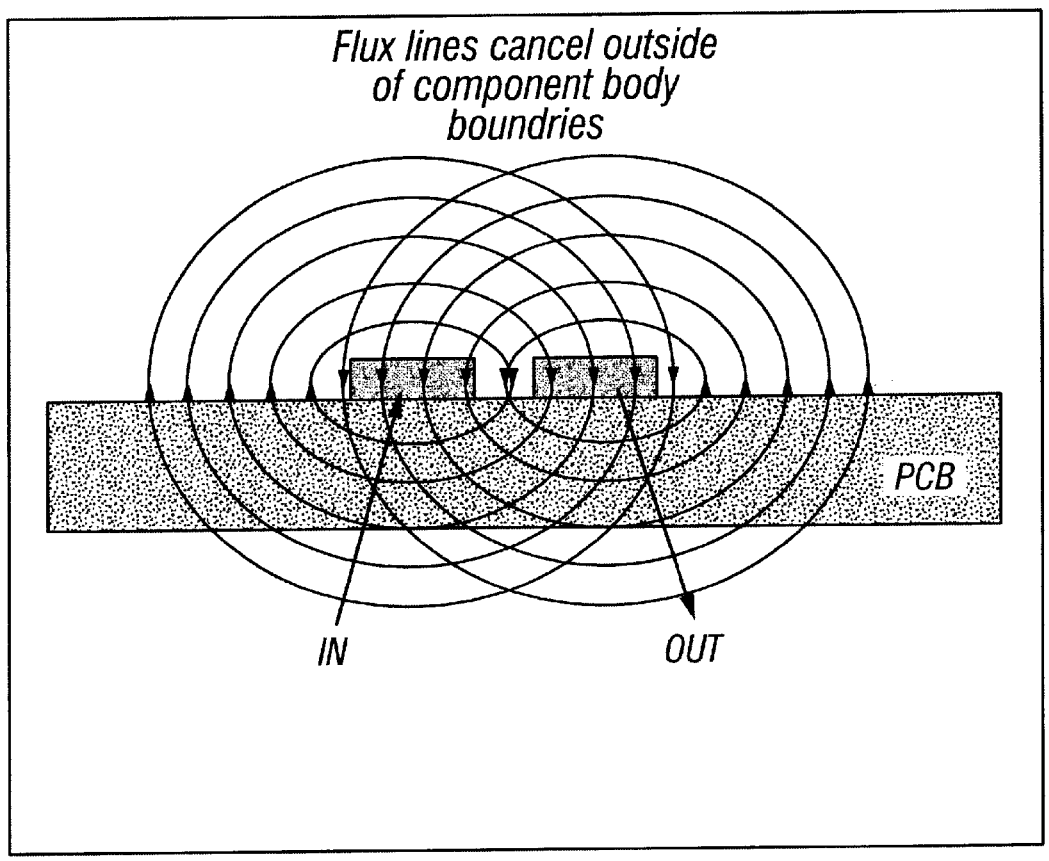
FIG. 1B is an end view, illustrating cancellation of flux lines as a result of the capacitor arrangement of FIG. 1A.

For a thorough understanding of the subject invention, reference is made to the following Description, which includes the appended Claims, in connection with the above-described Drawings.

Refer now to FIG. 1 (including FIGS. 1A, 1B, 1C and 1D), which depicts an embodiment of the invention according to which a pair of decoupling capacitors, C1 and C2, are mounted on an upper exterior surface 31, a printed circuit board 3. In a particular embodiment of the invention, PCB is a multilayer board, the various layers of which may be more readily discerned in FIG. 1C, which is a cross-sectional view taken along the plane $C^1$—$C^1$, and FIG. 1D, which is a cross-sectional view taken along the plane $D^1$—$D^1$.

FIG. 1 depicts an embodiment in which the decoupling capacitors are laterally juxtaposed on PCB 1. As may be seen in FIGS. 1C and 1D, each of the coupling capacitors comprises a respective dielectric body portion (11, 21), first conductive terminal (12, 22) and second conductive terminal (13, 23). If each of the decoupling capacitors assumes the form of a rectangular parallelepiped, then respective axes may be defined as extending through the center of the respective body portions of the capacitors and between the centers of the respective first and second conductive terminals. With the capacitor axes so defined, then lateral juxtaposition, as used above, signifies that the axis of C1 extends in a manner parallel to the axis of C2, and that both axes reside in an imaginary plane (not shown) that is substantially parallel to the first exterior surface of the PCB 3.

The essence of the inventive embodiment depicted in FIG. 1 is that the decoupling capacitors C1 and C2 are electrically interconnected by a conductive array 4 that comprises conductive pads 41, 42, 43, and 44. The conductive array also includes vias 45, 46, 47, and 48. In a manner well understood by those skilled in the art, pads 41, 42, 43, and 44 are etched onto surface 31 of PCB. C1 is mounted on PCB by connecting, as by soldering, conductive terminal 12 to pad 41 and conductive terminal 13 to pad 42. Similarly, conductive terminal 21 of C2 is connected to pad 43, and conductive terminal 22 is connected to pad 44.

Figure 1C:
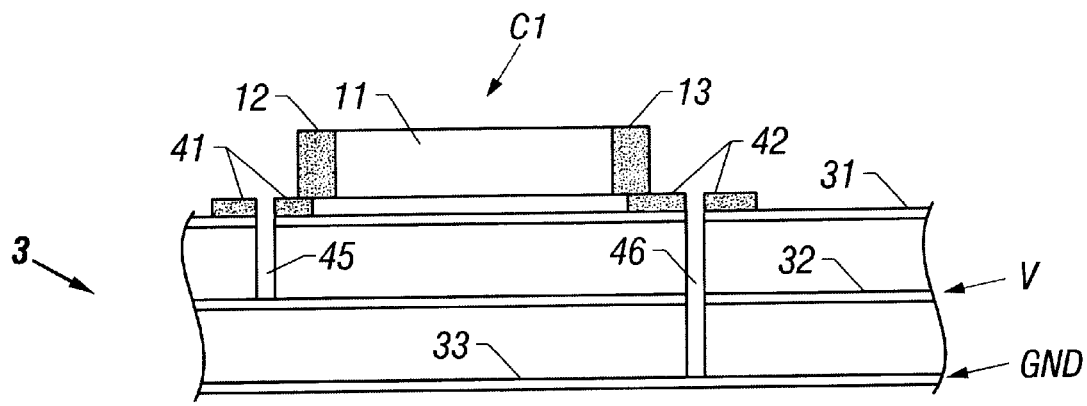
FIGS. 1C and 1D are cross-sectional views, illustrating in detail the manner in which the laterally juxtaposed capacitors are electrically interconnected.
Figure 1D:
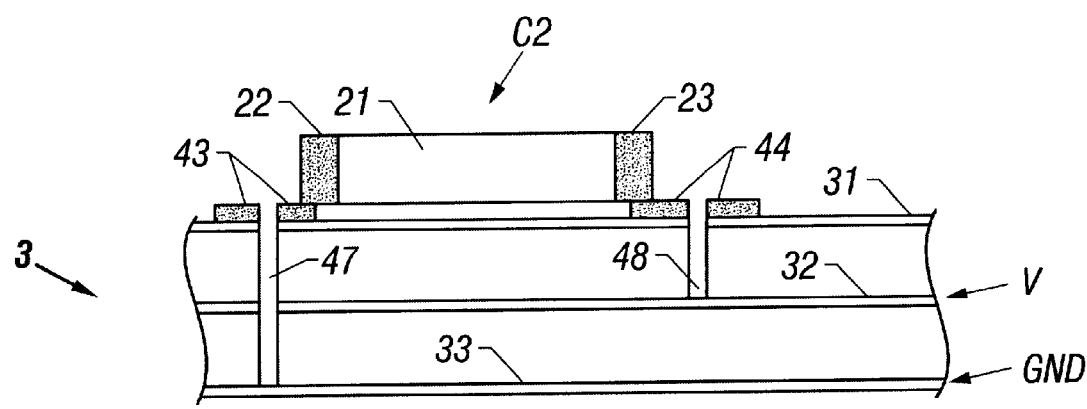

As may be seen in FIG. 1C, the first conductive terminal 12 of capacitor C1 is electrically coupled through a conductor comprising pad 41 and via 45 to a first internal conductive layer 32. Via 45 extends from surface 31 of PCB 3 to conductive layer 32. In the present embodiment of the invention, conductive layer 32 is a power plane that is coupled to a voltage supply, V+. Similarly, the second conductive terminal 13 of C1 is electrically coupled through a conductor comprising pad 42 and via 46 to a second internal conductive layer 33. Via 46 extends from surface 31 of PCB 3 to conductive layer 33. In the present embodiment of the invention, conductive layer 33 is the return current path for the voltage supply V+. Although the voltage potential of conductive layer 33 need not necessarily be at earth potential, layer 33 is a system ground plane and, for purposes of this Description, will be referred to as GND.

With respect to C2, recall that C2 is laterally juxtaposed (in the manner defined above) to C1 on surface 31 of PCB 3. As may be seen in FIG. 1D, the first conductive terminal 22 of capacitor C2 is electrically coupled through a conductor comprising pad 43 and via 47 to the second internal conductive layer 33 (GND). Via 47 extends from surface 31 of PCB 3 to the ground plane GND. Similarly, the second conductive terminal 23 of C2 is electrically coupled through a conductor comprising pad 44 and via 48 to internal lay 32, that is the power plane V+.

As a result of the physical arrangement of C1 and C2 on PCB 3, and the electrical connection between C2 and C3, respectively, and V+ and GND, respectively, as effected by the conductor array comprising pads 41, 42, 43, and 44 and vias 45, 46, 47, and 48, C1 and C2 are electrically connected in parallel across V+ and GND. This minimizes the effect of parasitic lead inductance, as explained above. However, the discharge currents that flow in C1 and C2 as a result of, for example, logic state transitions, traverse in opposite directions. Accordingly, the flux lines surrounding C1 and C2 likewise travel in opposite directions. See FIG. 1D. Consequently, the mutual inductance between C1 and C2 is substantially increased. This, in turn, reduces the parasitic inductance, ideally to zero, and thereby decreases the radiated field, likewise ideally to zero.

Figure 2:
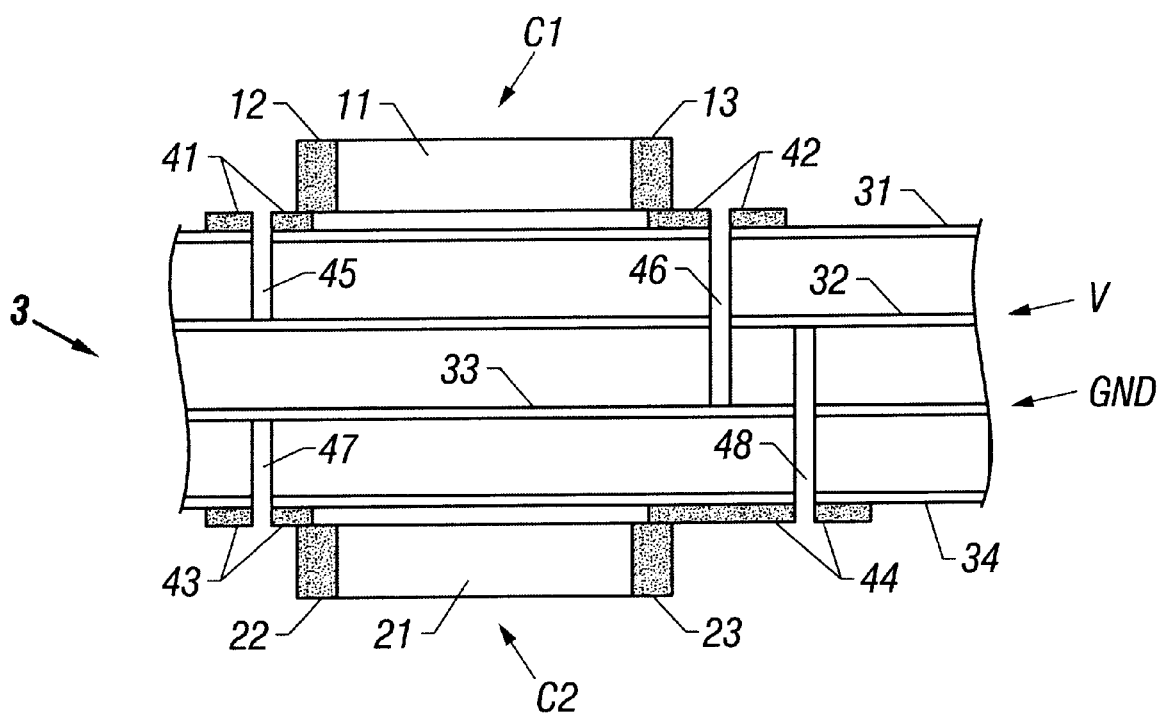
FIG. 2 is a cross-sectional view of an embodiment of the invention in which a capacitor pair is orthogonally juxtaposed about opposite surfaces of a PCB.

A second embodiment of the invention is depicted in FIG. 2. In that arrangement, decoupling capacitor C1 remains positioned on, and affixed to, first surface 31 of PCB 3. However, rather than the lateral juxtaposition of C2 illustrated in FIG. 1, C2 is now positioned on, and affixed to, a second exterior surface 34 of PCB 3. In this configuration, C1 and C2 may be said to be orthogonally juxtaposed about PCB 3. That is, if each of the decoupling capacitors is assumed to be characterized by a second axis that extends through the centers of the respective capacitors, in a direction orthogonal to their respective first axes (and substantially orthogonal to surfaces 31 and 34 of PCB 3), then, in the context of this Description, orthogonal alignment means that the respective second axes of C1 and C2 are collinear.

As may be seen in FIG. 2, the first conductive terminal 12 of capacitor C1 is electrically coupled through the conductor comprising pad 41 and via 45 to the first internal conductive layer 32. Via 45 extends from surface 31 of PCB 3 to conductive layer 32. Similarly, the second conductive terminal 13 of C1 is electrically coupled through the conductor comprising pad 42 and via 46 to the second internal conductive layer 33. Via 46 extends from surface 31 of PCB 3 to conductive layer 33.

With respect to C2, recall that C2 is orthogonally juxtaposed (in the manner defined above) to C1 on surface 34 of PCB 3. As may be seen in FIG. 2, the first conductive terminal 22 of capacitor C2 is electrically coupled through a conductor comprising pad 43 and via 47 to the second internal conductive layer 33 (GND). Via 47 extends from surface 31 of PCB 3 to the ground plane GND. Similarly, the second conductive terminal 23 of C2 is electrically coupled through a conductor comprising pad 44 and via 48 to internal lay 32, that is, the power plane V+.

As a result of the physical arrangement of C1 and C2 on PCB 3, and the electrical connection between C2 and C3, respectively, and V+ and GND, respectively, as effected by the conductor array comprising pads 41, 42, 43, and 44 and vias 45, 46, 47, and 48, C1 and C2 are electrically connected in parallel across V+ and GND. As with the arrangement depicted in FIGS. 1A, 1B, and 1C, this minimizes the effect of parasitic lead inductance, as explained above. However, the discharge currents that flow in C1 and C2 as a result of, for example, logic state transitions, traverse in opposite directions. Accordingly, the flux lines surrounding C1 and C2 likewise travel in opposite directions. Consequently, the mutual inductance between C1 and C2 is substantially increased. This, in turn, reduces the parasitic inductance, ideally to zero, and thereby decreases the radiated field, likewise ideally to zero.

Figure 3:
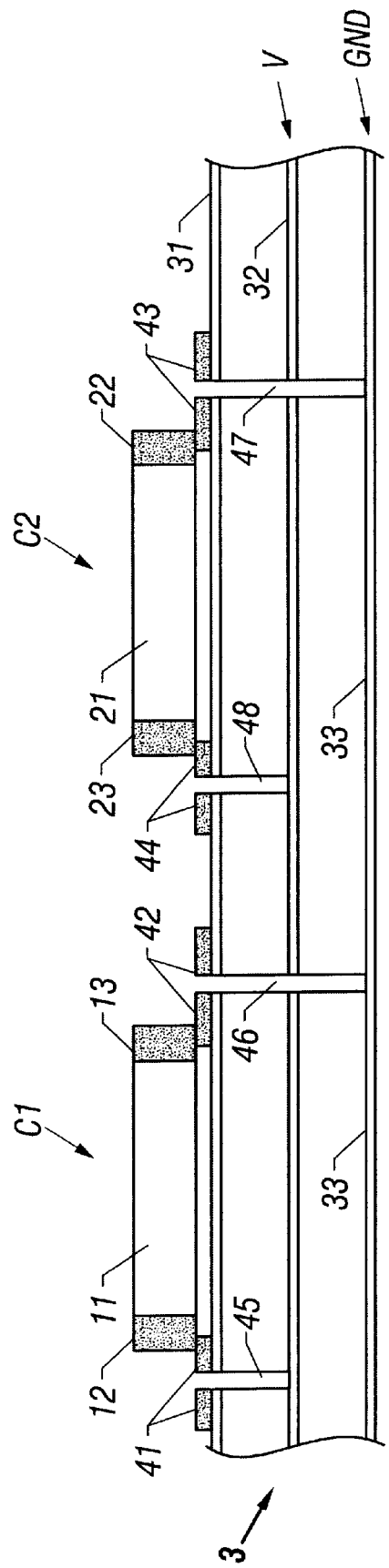
FIG. 3 is a cross-sectional view of an embodiment of the invention in which a capacitor pair is axially aligned on a surface of a PCB.

A third embodiment of the invention is depicted in FIG. 3. In that embodiment, capacitors C1 and C2 are axially aligned, in an end-to-end relationship on exterior surface of 31 of PCB 3. That is, C1 and C2 are positioned on surface 31 of PCB 3 so that their respective first axes (as that term is defined above) are collinear.

As may be seem in FIG. 3, the first conductive terminal 12 of capacitor C1 is electrically coupled through the conductor comprising pad 41 and via 45 to the first internal conductive layer 32. Via 45 extends from surface 31 of PCB 3 to conductive layer 32. Similarly, the second conductive terminal 13 of C1 is electrically coupled through the conductor comprising pad 42 and via 46 to the second internal conductive layer 33. Via 46 extends from surface 31 of PCB 3 to conductive layer 33.

With respect to C2, notice that C2 is axially aligned (in the manner defined above) to C1 on surface 31 of PCB 3. As may be seen in FIG. 3, the first conductive terminal 22 of capacitor C2 is electrically coupled through a conductor comprising pad 43 and via 47 to the second internal conductive layer 33 (GND). Via 47 extends from surface 31 of PCB 3 to the ground plane GND. Similarly, the second conductive terminal 23 of C2 is electrically coupled through a conductor comprising pad 44 and via 48 to internal lay 32, that is, the power plane V+.

As a result of the physical arrangement of C1 and C2 on PCB 3, and the electrical connection between C2 and C3, respectively, and V+ and GND, respectively, as effected by the conductor array comprising pads 41, 42, 43, and 44 and vias 45, 46, 47, and 48, C1 and C2 are electrically connected in parallel across V+ and GND. As with the arrangement depicted in FIGS. 1 and 2, this minimizes the effect of parasitic lead inductance, as explained above. However, in contradiction to the arrangements of the embodiments described above, the discharge currents that flow in C1 and C2 as a result of, for example, logic-state transitions, traverse those capacitors in the same direction. Accordingly, the flux lines surrounding C1 and C2 likewise surround those capacitors in the same direction. However, the currents flowing through vias 45, 46, 47 and 48 give rise to mutual inductances between those vias. Consider for example, the mutual inductance between via 46 and via 48.

The general expression for mutual inductive coupling between two vias is:

$$M = \frac{\mu_0}{2\pi} l \left\{ \ln\left[\frac{l}{d} + \sqrt{\left(\frac{l}{d}\right)^2 + 1}\right] + \frac{d}{l} - \sqrt{\left(\frac{d}{l}\right)^2 + 1} \right\},$$

where "l" is the length of the via and "d" is the center-to-center distance between the vias, in meters, and $\mu_{hd\ 0}$ is the permeability of free space and is equal to $4\pi \times 10^7$ henry/meter. Therefore, the voltage drop across via 46 is given by the expression:

$$V_{46} = sLI_{46} - sMI_{48},$$

where L is the inductance of the via (see above), $I_{46}$ is the current flowing in via 46, and $I_{48}$ is the current flowing in via 48. When $I_{46}=I_{48}$, then $V_{46=s(L-M)I46}$. In this manner, it has been found that the effects of parasitic inductance associated with the via can be reduced, by approximately 10%.

Although the subject invention has been described with respect to the specific exemplary embodiments disclosed above, the invention is not limited to those embodiments. Various modifications, improvements, and additions may be implemented by those skilled in the art; and such modifications, improvements, and additions are comprehended within, or are to be deemed equivalent to, the scope of the appended Claims. For example, the invention is disclosed in the context of multilayer PCBs. However, the structure of the PCB is not a requisite element of the invention, which has applicability to other PCB structures. Furthermore, the invention is described as embracing laterally juxtaposed, orthogonally juxtaposed and axially aligned capacitor pairs. However, the scope of the invention is scaleable to arrangements consisting of more than two capacitors and to orientations constituting combinations of the orientations specifically disclosed. In addition, although the invention is described in the context of PCBs that implement conductive arrays comprising conductive terminals inherent to the decoupling capacitors, as well as pads and vias that may be viewed as elements of the PCB, those having ordinary skill in the art readily appreciate that the inventive concept disclosed hererin extends to conductive arrays of other forms, and PCB pads and vias represent only a specific instantiation of the invention.

What is claimed is:

1. A circuit assembly comprising:
   a printed circuit board (PCB) characterized by a first surface, a first conductive layer, and a second conductive layer;
   first and second discrete capacitive elements, each of the capacitive elements having conductive terminals disposed at opposing extremities of the associated capacitive element, the capacitive elements mutually juxtaposed on the first surface of the PCB so that the first conductive terminal of the first capacitive element is disposed adjacent to the first conductive terminal of the second capacitive element and remotely from the second conductive terminal of the second capacitive element; and
   a first conductor coupling the first conductive terminal of the first capacitive element to the first conductive layer;
   a second conductor coupling the second conductive terminal of the first capacitive element to the second conductive layer;
   a third conductor coupling the first conductive terminal of the second capacitive element to the second conductive layer; and
   a fourth conductor coupling the second conductive terminal of the second capacitive element to the first conductive layer.

2. A circuit assembly as defined in claim 1, wherein each of the conductors comprises a via.

3. A circuit assembly as defined in claim 1 wherein the first conductor comprises a via extending between the first surface and the first conductive layer.

4. A circuit assembly as defined in claim 1, wherein the second conductor comprises a via extending between the first surface and the second conductive layer.

5. A circuit assembly as defined in claim 1, wherein the third conductor comprises a via extending between the first surface and the second conductive layer.

6. A circuit assembly as defined in claim 1, wherein the fourth conductor comprises a via extending between the first surface and the first conductive layer.

7. A circuit assembly as defined in claim 1, wherein the first conductor comprises a first pad contiguous to the first conductive terminal of the first capacitive element, the second conductor comprises a second pad contiguous to the second conductive terminal of the first capacitive element, the third conductor comprises a third pad contiguous to the first conductive terminal of the second capacitive element, and the fourth conductor comprises a fourth pad contiguous to the second conductive terminal of the second capacitive element.

8. A circuit assembly as defined in claim 7, wherein the first conductor comprises a first via coupling the first pad to the first internal conductive layer; the second conductor comprises a second via coupling the second pad to the second internal conductive layer; the third conductor comprises a third via coupling the third pad to the second internal conductive layer; and the fourth conductor comprises a fourth via coupling the fourth pad to the first internal conductive layer.

9. A circuit assembly as defined in claim 8, wherein the first conductive layer is coupled to a voltage source.

10. A circuit assembly as defined in claim 9, wherein the second conductive layer is coupled to a reference potential for the voltage source.

11. A circuit assembly comprising:
    a printed circuit board (PCB) characterized by a first exterior surface, a first conductive layer, and a second conductive layer;
    first and second discrete capacitive elements, each of the capacitive elements having conductive terminals disposed at opposing extremities of the associated capacitive element, the capacitive elements mutually juxtaposed on the first exterior surface of the PCB so that the first conductive terminal of the first capacitive element is disposed adjacent to the first conductive terminal of the second capacitive element and remotely from the second conductive terminal of the second capacitive element; and a conductor array coupling two of the conductive terminals to the first conductive layer and coupling two of the conductive terminals to the second conductive layer; wherein the conductor array comprises:

a first conductor contiguous to the first conductive terminal of the first capacitive element and extending to the first conductive layer;

a second conductor contiguous to the second conductive terminal of the first capacitive element and extending to the second conductive layer;

a third conductor contiguous to the first conductive terminal of the second capacitive element and extending to the second conductive layer; and a fourth conductor contiguous to the second conductive terminal of the second capacitive element and extending to the first conductive layer.

12. A circuit assembly as defined in claim 11, wherein the first conductive layer is a power plane and the second conductive layer is a ground plane.

13. A circuit assembly as defined in claim 11, wherein each of the conductors comprises a pad that is contiguous to a conductive terminal and a via.

14. A circuit assembly as defined in claim 13, wherein the first internal conductive layer is a power plane and the second internal conductive layer is a ground plane.

15. A circuit assembly comprising:

a printed circuit board (PCB) characterized by a first exterior surface, a second exterior surface, a first internal conductive layer, and a second internal conductive layer;

first and second discrete capacitive elements, each of the capacitive elements having respective first and second conductive terminals disposed at opposing extremities of the associated capacitive element, the first capacitive element positioned on the first exterior surface and the second capacitive element positioned on the second exterior surface, substantially orthogonally aligned with the first capacitive element; and a conductive array selectively coupling each of the conductive terminals of the capacitive elements to either the first internal conductive layer or to the second internal conductive layer for reducing electromagnetic coupling between the capacitive elements.

16. A circuit assembly as defined in claim 15, wherein the conductor array comprises:

a first conductor contiguous to the first conductive terminal of the first capacitive element and extending to the first internal conductive layer;

a second conductor contiguous to the second conductive terminal of the first capacitive element and extending to the second internal conductive layer;

a third conductor contiguous to the first conductive terminal of the second capacitive element and extending to the second internal conductive layer; and a fourth conductor contiguous to the second conductive terminal of the second capacitive element and extending to the first internal conductive layer.

17. A circuit assembly as defined in claim 16, wherein the first internal conductive layer is a power plane and the second internal conductive layer is a ground plane.

18. A circuit assembly as defined in claim 16, wherein each of the conductors comprises pad that is contiguous to a conductive terminal and a via.

19. A circuit assembly as defined in claim 18, wherein the first internal conductive layer is a power plane and the second internal conductive layer is a ground plane.

20. A printed circuit board (PCB) adapted for the arrangement of at least two capacitive elements, each of which capacitive elements has respective first and second conductive terminals, the PCB comprising:

an exterior surface for supporting the capacitive elements;

a first internal conductive layer;

a second internal conductive layer; and a conductive array for selectively coupling each of the conductive terminals of the capacitive elements to either the first internal conductive layer or the second internal conductive layer and for reducing electromagnetic coupling between the capacitive elements, wherein the conductive array comprises:

a first conductor disposed for connection to the first conductive terminal of the first capacitive element and extending between the exterior surface and the first internal conductive layer;

a second conductor disposed for connection to the second conductive terminal of the first capacitive element and extending between the exterior surface and the second interior conductive layer;

a third conductor disposed for connection to the first conductive terminal of the second capacitive element and extending between the exterior surface and the second internal conductive layer; and a fourth conductor disposed for connection to the second conductive terminal of the second capacitive element and extending between the exterior surface and the first internal conductive layer.

21. A circuit assembly as defined in claim 20, wherein the first internal conductive layer is a power plane and the second internal conductive layer is a ground plane.

22. A circuit assembly as defined in claim 20, wherein each of the conductors comprises a pad that is contiguous to a conductive terminal and a via.

23. A circuit assembly as defined in claim 22, wherein the first internal conductive layer is a power plane and the second internal conductive layer is a ground plane.

24. A circuit assembly comprising:

a printed circuit board (PCB) characterized by an exterior surface, a first conductive layer, and a second conductive layer;

first and second discrete capacitive elements, each of the capacitive elements having respective first and second conductive terminals disposed at opposing extremities of the associated capacitive element, the capacitive elements axially aligned on the exterior surface of the PCB so that the first conductive terminal of the first capacitive element is disposed remotely from the first conductive terminal of the second capacitive element and in proximity to the second conductive terminal of the second capacitive element; and a first conductor coupling the first conductive terminal of the first capacitive element to the first conductive layer;

a second conductor coupling the second conductive terminal of the first capacitive element to the second conductive layer;

a third conductor coupling the first conductive terminal of the second capacitive element to the second conductive layer; and a fourth conductor coupling the second conductive terminal of the second capacitive element to the first conductive layer.

25. A circuit assembly as defined in claim 24, wherein each of the conductors comprises a via.

26. A circuit assembly as defined in claim 25, wherein the first conductor comprises a first pad contiguous to the first conductive terminal of the first capacitive element, the second conductor comprises a second pad continuous to the second conductive terminal of the first capacitive element, the third conductor comprises a third pad contiguous to the first conductive terminal of the second capacitive element, and the fourth conductor comprises a fourth pad contiguous to the second conductive terminal of the second capacitive element.

27. A circuit assembly as defined in claim 26, wherein the first conductor comprises a first via coupling the first pad to the first internal conductive layer; the second conductor comprises a second via coupling the second pad to the second internal conductive layer; the third conductor comprises a third via coupling the third pad to the second internal conductive layer; and the fourth conductor comprises a fourth via coupling the fourth pad to the first internal conductive layer.

28. Electronic equipment comprising a printed circuit assembly, the printed circuit assembly in turn comprising:
   a printed circuit board (PCB) having a first exterior surface, a first internal conductive layer, and a second internal conductive layer;
   a first discrete capacitive element having first and second conductive terminals disposed at opposing extremities of the first capacitive element;
   a first conductor coupling the first conductive terminal of the first capacitive element to the first conductive layer; and
   a second conductor coupling the second conductive terminal of the first capacitive element to the second conductive layer.

29. Electronic equipment as defined in claim 28, wherein the first conductor comprises a first pad contiguous to the first conductive terminal of the first capacitive element and a first via coupling the first pad to the first internal conductive layer and the second conductor comprises a second pad contiguous to the second conductive terminal of the first capacitive element and a second via coupling the second pad to the second internal conductive layer.

30. Electronic equipment as defined in claim 29, wherein the first internal conductive layer is a power plane and the second internal conductive layer is a return for the power plane.

31. Electronic equipment as defined in claim 28, wherein the printed circuit assembly further comprises:
   a second capacitive element having first and second conductive terminals disposed at opposing extremities of the second capacitive elements, the second capacitive element laterally juxtaposed to the first capacitive element on the first exterior surface of the PCB;
   a third conductor coupling the first conductive terminal of the second capacitive element to the second internal conductive layer; and
   a fourth conductor coupling the second conductive terminal of the second capacitive element to first internal conductive layer.

32. Electronic equipment as defined in claim 31, wherein the third conductor comprises a third pad contiguous to the first conductive terminal of the second capacitive element and a third via coupling the third pad to the second internal conductive layer and the fourth conductor comprises a fourth pad contiguous to the second conductive terminal of the second capacitive element and a fourth via coupling the fourth pad to the fourth internal conductive layer.

33. Electronic equipment as defined in claim 32, wherein the first internal conductive layer is a power plane and the second internal conductive layer is a return for the power plane.

34. Electronic equipment as defined in claim 28, wherein the printed circuit assembly additionally comprises:
   a PCB having a second exterior surface substantially parallel to the first exterior surface;
   a second discrete capacitive element having first and second conductive terminals disposed at opposing extremities of the second capacitive element, the second capacitive element position on the second exterior surface at a position orthogonally juxtaposed to the first capacitive element;
   a third conductor coupling the first conductive terminal of the second capacitive element to the second internal conductive layer; and
   a fourth conductor coupling the second conductive terminal of the second capacitive element o first internal conductive layer.

35. Electronic equipment as defined in claim 34, wherein the third conductor comprises a third pad contiguous to the first conductive terminal of the second capacitive element and a third via coupling the third pad to the second internal conductive layer and the fourth conductor comprises a fourth pad contiguous to the second conductive terminal of the second capacitive element and a fourth via coupling the fourth pad to the fourth internal conductive layer.

36. Electronic equipment as defined in claim 35, wherein the first internal conductive layer is a power plane and the second internal conductive layer is a return for the power plane.

* * * * *